United States Patent
Maejima

(10) Patent No.: US 7,183,840 B2
(45) Date of Patent: Feb. 27, 2007

(54) CLASS-D AMPLIFIER

(75) Inventor: Toshio Maejima, Iwata (JP)

(73) Assignee: Yamaha Corporation, Hamamatsu (JP)

( * ) Notice: Subject to any disclaimer, the term of this patent is extended or adjusted under 35 U.S.C. 154(b) by 113 days.

(21) Appl. No.: 10/967,807

(22) Filed: Oct. 18, 2004

(65) Prior Publication Data

US 2005/0162223 A1   Jul. 28, 2005

(30) Foreign Application Priority Data

Oct. 17, 2003   (JP)   ............ P2003-357631

(51) Int. Cl.
*H03F 3/38* (2006.01)
*H03F 3/217* (2006.01)

(52) U.S. Cl. ...................... 330/10; 330/251

(58) Field of Classification Search ............ 330/207 A, 330/251
See application file for complete search history.

(56) References Cited

U.S. PATENT DOCUMENTS

2006/0006933 A1 *   1/2006   Nguyen ............... 330/10

* cited by examiner

*Primary Examiner*—Steven J. Mottola
(74) *Attorney, Agent, or Firm*—Pillsbury Winthrop Shaw Pittman LLP

(57) ABSTRACT

A class-D amplifier for pulse-width-modulating an analog input signal to output a pulse-width-modulated signal, includes: a differentiating circuit for differentiating the pulse-width-modulated signal of the class-D amplifier; and a negative feedback circuit for feeding back the differentiated signal of the differentiating circuit to an input side of the class-D amplifier in a negative feedback manner.

6 Claims, 5 Drawing Sheets

CLASS-D AMPLIFIER

BACKGROUND OF THE INVENTION

The present invention is related to a class-D amplifier.

Class-D amplifiers perform power amplifications by pulse-width-modulating (PWM) input signals, and are utilized so as to perform power amplifications of audio signals. As related class-D amplifiers, there is such a class-D amplifier which is arranged by a pulse width modulating unit for pulse-width-modulating analog input signals, a low-pass filter positioned at a post stage of the pulse width modulating unit, and a damper circuit positioned at a post stage of the low-pass filter. A speaker, or the like, which constitutes a load is connected parallel to this damper circuit.

FIG. 6 shows an example of a conventional class-D amplifier (self-excited type). A pulse width modulating unit provided in this conventional class-D amplifier is arranged by a resistor R1, an operational amplifier 11, a capacitor C1, a comparator 12, a switch driving circuit 13, a switch circuit 14, and a resistor R2. The resistor R1 constitutes an input terminal of an analog input signal. Both the operational amplifier 11 and the capacitor C1 constitute an integrator which integrates the analog input signal. The comparator 12 compares an output of the integrator with a predetermined reference value. The switch driving circuit 13 outputs a pulse signal corresponding to an output signal of the comparator 12 as a BTL (Bridged Tied Load) type signal. The switch circuit 13 is driven by an output of the switch driving circuit 13. The resistor R2 constitutes a negative feedback circuit which feeds back the output of the switch circuit 14 to the input side of the integrator in a negative feedback manner. A low-pass filter constructed of both a coil "L" and a capacitor "C2" is connected at a post stage of this pulse width modulating circuit. A damper circuit constituted by series-connecting the capacitor C6 to the resistor R4 is connected at a post stage of this low-pass filter. In other words, one end of this damper circuit is connected to the output terminal of the above-described low-pass filter, and the other end of the damper circuit is connected to the earth. A load 16 constructed of a speaker, or the like is connected parallel to the damper circuit. The above-explained damper circuit damps a peak of an output which is produced at a resonant frequency of the low-pass filter (LC circuit) when the class-D amplifier is brought into either no load condition or a light load condition.

As a conventional power amplifier, there is such a power amplifier equipped with a class-D power amplifying circuit, a peak voltage detecting circuit for detecting a peak voltage of the output voltages of the class-D power amplifying circuit, and a drive voltage control circuit arranged at a prestage of the class-D power amplifying circuit (for example, refer to FIG. 1 of patent publication 1). This peak voltage detecting circuit detects the peak value of the output voltages of the class-D power amplifying circuit, and controls the drive voltage control circuit based upon the detected peak value, so that the output peak of the class-D power amplifying circuit is suppressed.

As a conventional protection circuit of a motor driving circuit, such a protection circuit is provided. That is, while a plurality of transistors (drive elements) are connected by way of a bridged connecting manner so as to constitute a motor driving circuit, a diode is connected to one end of this transistor in order to protect this transistor (for instance, refer to FIG. 1 of patent publication 2). patent publication 1;

Japanese Laid-open Patent Application No. Hei-3-55905 patent publication 2:

Japanese Patent Publication No. Hei-6-59011

However, in the conventional class-D amplifier (self-excited type) shown in FIG. 6, in order to damp the output peak produced at the resonant frequency of the low-pass filter (LC circuit) in the case that the conventional class-D amplifier is brought into the light load condition, the above-explained damper circuit (constructed of capacitor C6 and resistor R4) is required. A loss current may flow through the resistor 4 functioning as the structure elements of this damper circuit even in the case that the conventional class-D amplifier is operated under the normal load condition. As a consequence, in the above-described conventional class-D amplifier, the damper circuit is necessarily required, which impedes the improvement in the efficiency of this class-D amplifier.

The conventional power amplifier described in the above-described patent publication 1 owns such a problem that in order to suppress the output peak of the class-D power amplifier, the complex circuit such as the peak voltage detecting circuit and the drive voltage control circuit other than the class-D amplifier is required.

Further, in the conventional protection circuit of the motor driving circuit described in the above-mentioned patent publication 2, although the transistors functioning as the drive elements are protected, the high voltage may be produced across the load of the motor driving circuit. Both a coil and a capacitor which are directly connected to the motor (load) cannot be protected, and thus, there are some possibilities that these coil and capacitor are electrically destroyed.

SUMMARY OF THE INVENTION

The present invention has been made to solve the above-described problems, and therefore, is to provide a class-D amplifier capable of suppressing an output peak when the class-D amplifier is brought into either no load condition or a light load condition.

In order to solve the aforesaid object, the invention is characterized by having the following arrangement.

(1) A class-D amplifier, comprising:
   a pulse width modulating circuit that pulse-width-modulates an analog input signal to output a pulse-width-modulated signal;
   a low-pass filter that inputs the pulse-width-modulated signal output from the pulse width modulating circuit;
   a differentiating circuit that differentiates the output of the low-pass filter; and
   a negative feedback circuit that feeds back the differentiated signal of the differentiating circuit to an input side of the class-D amplifier in a negative feedback manner.

(2) The class-D amplifier according to (1), wherein the pulse width modulating circuit includes:
   an integrator for integrating the analog input signal;
   a comparator for comparing an integrated analog signal output from the integrator with a desirable reference value; and
   a negative feedback circuit for feeding back a pulse output of the comparator to an input side of the integrator in a negative feedback manner.

(3) The class-D amplifier according to (2), wherein the pulse width modulating circuit includes:
   a switch driving circuit for outputting the pulse signal outputted from the comparator as one pair of pulse signals having phases opposite to each other; and a switch circuit that is driven by the switch driving circuit, the switch driving circuit and the switch circuit being arranged at a post stage of the comparator, wherein the negative feedback circuit feeds back the output of said switch circuit to the input side of said integrator in the negative feedback manner.

(4) The class-D amplifier according to (3), wherein:

the switch circuit includes two transistors, each of control terminals of the two transistors is connected to any one of two output terminals of the switch driving circuit, output terminals of the two transistors are series-connected to each other, and a connection portion between the output terminals is used as the output of the pulse width modulating circuit and the input of the negative feedback circuit.

(5) The class-D amplifier according to (1), wherein the differentiating circuit includes a capacitor.

(6) The class-D amplifier according to (1), wherein the differentiating circuit includes two capacitors connected in a series manner, and a resistor connected between a junction point of the two capacitors and a ground.

In accordance with the present invention, the class-D amplifier can be provided which is capable of suppressing the output peak when the class-D amplifier is operated under no load condition, or under light load condition.

In accordance with the present invention, the class-D amplifier can be provided which is capable of suppressing the output peak when the class-D amplifier is operated under no load condition, or under light load condition, and also, is capable of improving the efficiency of the class-D amplifier.

Further, in accordance with the present invention, the class-D amplifier can be provided which is capable of suppressing the output peak when the class-D amplifier is operated under no load condition, or under light load condition, and further, which can be realized by the simple circuit arrangement.

In accordance with the present invention, the class-D amplifier can be provided which is capable of suppressing the output peak when the class-D amplifier is operated under no load condition, or under light load condition, and further, which can avoid that the load and the structural components thereof are electrically destroyed.

DETAILED DESCRIPTION OF PREFERRED EMBODIMENTS

Referring now to drawings, various embodiment modes of the present invention will be described.

Figure 1:
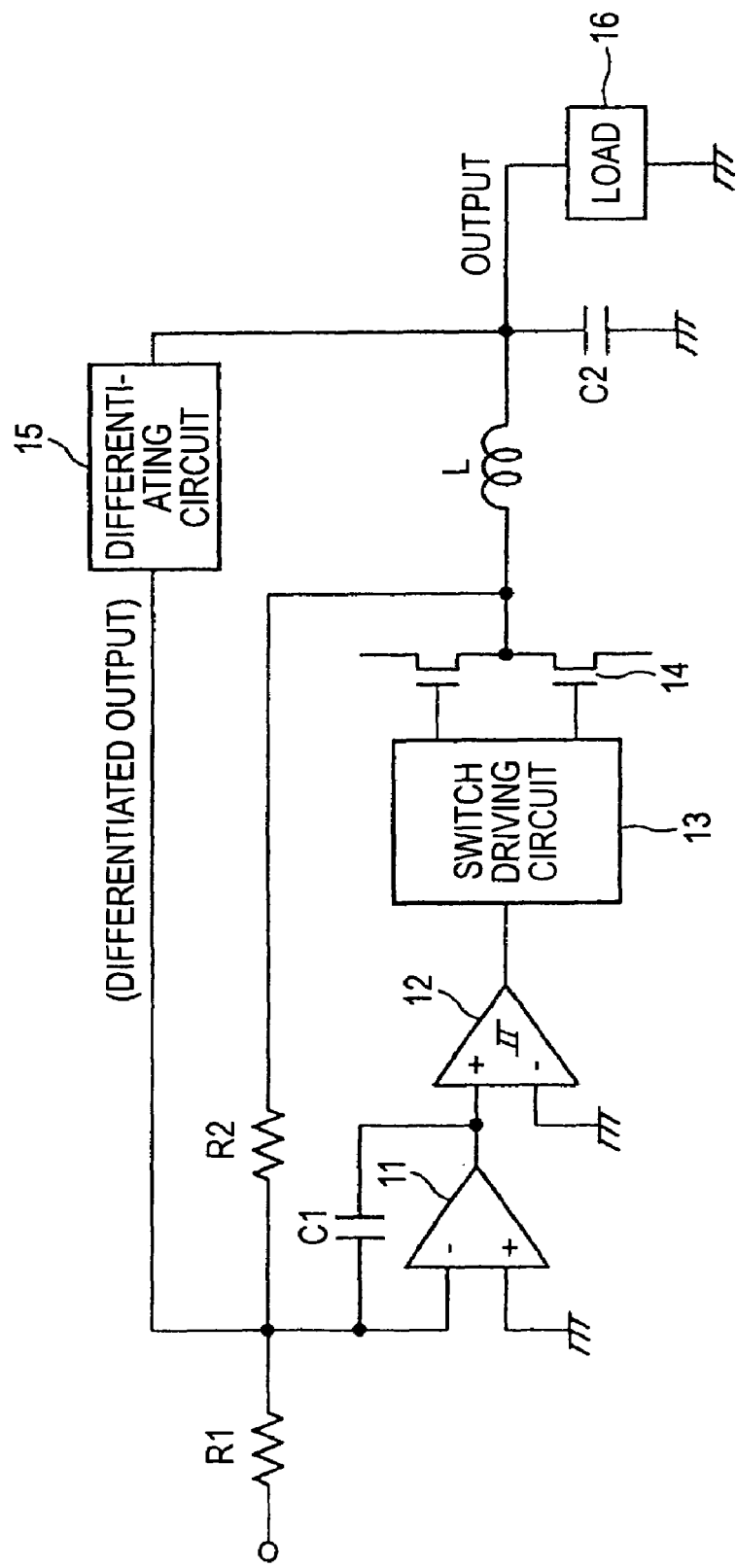
FIG. 1 is a circuit diagram for indicating a structural example of a class-D amplifier according to an embodiment mode of the present invention.

FIG. 1 is a circuit diagram for indicating a structural example of a class-D amplifier (self-excited type) according to an embodiment mode of the present invention.

This class-D amplifier is arranged by resistors R1 and R2, capacitors C1 and C2, an operational amplifier 11, a comparator (normally, hysteresis comparator) 12, a switch driving circuit 13, a switch circuit 14, a coil "L", and a differentiating circuit 15. In this circuit, the resistors R1 and R2, the capacitor C1, the operational amplifier 11, the comparator 12, the switch driving circuit 13, and the switch circuit 14 constitute a pulse width modulating (PWM) circuit.

Next, a description is made of this pulse width modulating circuit. One end of the resistor R1 constitutes an input terminal of an analog input signal. Both the operational amplifier 11 and the capacitor C1 constitute an integrator. Then, the comparator 12 compares the earth potential (zero volt) corresponding to a reference value with an output of the integrator, and then outputs a comparison result (pulse signal) thereof. The switch driving circuit 13 receives the pulse signal outputted from the comparator 12 and then outputs one pair of such pulse signals having phases opposite to each other. In other words, the switch driving circuit 13 converts the pulse signal outputted from the comparator 12 into BTL (Bridged Tied Load) type signals, and then, outputs the BTL type signals.

The switch circuit 14 is constituted by two transistors which are driven in response to the BTL type output signals of the switch driving circuit 13. In other words, each of control terminals of the two transistors (for instance, FETs) which constitute the switch circuit 14 is connected to any one of the two output terminals of the switch driving circuit 13. Then, respective output terminal of the two transistors which constitute the switch circuit 14 are series-connected to each other. A junction point of the respective output terminals of these two transistor constitutes an output of the pulse width modulating circuit. The resistor R2 constitutes a feedback circuit which feeds back an output signal of the pulse width modulating circuit to the input terminal thereof in a negative feedback manner.

A low-pass filter constituted by the coil "L" and the capacitor C2 is connected at a post stage of the pulse width modulating circuit having the above-described circuit arrangement. An output of this low-pass filter constitutes an output of the class-D amplifier according to this embodiment mode, and drives a load 16. Further, the output signal of the low-pass filter is differentiated by the differentiating circuit 15, and then, the differentiated signal is fed back to the input side of this class-D amplifier in a negative feedback manner.

In other words, the differentiating circuit 15 may function as a differentiator which differentiates the output signal (namely, output signal of this class-D amplifier) of the low-pass filter, and may function a negative feedback circuit which feeds back this differentiated signal to the input terminal side of the class-D amplifier in the negative feedback manner. As a result, a phase of the output signal 6 from the low-pass filter is delayed by 180 degrees at a higher frequency than the LC resonant frequency, and if this phase-delayed signal of the low-pass filter is directly fed back to the class D amplifier in the negative feedback manner, then this phase-delayed signal may cause an oscillation, or the like, so that the entire circuit operation becomes unstable. To avoid this difficulty, in order to establish a stable negative feedback operation, margin is required in the phase. Thus, the phase is led in the differentiating circuit 15, so that the margin may be made in the phase and this signal having the led phase may become stable negative feedback signal.

In accordance with the class-D amplifier having the above-described circuit arrangement of this embodiment mode, the phase of the output signal from the class-D amplifier is led by the differentiating circuit 15, so that this differentiated signal having the led phase becomes a stable negative feedback signal. As a result, in this class-D amplifier, the output peak of the class-D amplifier can be suppressed which is produced when the class-D amplifier is operated either under no load condition or under light load condition, since both the coil "L" and the capacitor C2 (namely, low-pass filter) are resonated. As a consequence, in accordance with the class-D amplifier of this embodiment mode, the generation of the high voltage at the load terminal due to the resonance of the low-pass filter can be suppressed, so that this class-D amplifier can avoid that both the load 16 such as a speaker and the structural components (coil "L", capacitor C2 etc.) are electrically destroyed. For example, with respect to the class-D amplifier according to this embodiment mode, any one of a speaker operated as a light load and another speaker operated as a heavy load can be connected.

Figure 2A:
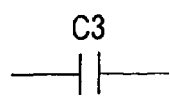
FIGS. 2A and 2B are diagrams for representing a concrete example of a differentiating circuit employed in the class-D amplifier shown in FIG. 1.

Next, a concrete example of the above-described differentiating circuit 15 will now be explained with reference to FIGS. 2A and 2B. FIGS. 2A and 25 are circuit diagrams for representing the concrete example of the differentiating circuit 15. FIG. 2A shows a first concrete example, and FIG. 2B indicates a second concrete example. For instance, as shown in FIG. 2A, this differentiating circuit 15 may be constituted by employing a single capacitor C3. As previously explained, since such a very simple circuit is used to construct the differentiating circuit 15, the output peak of the class-D amplifier can be suppressed which is caused by the resonance occurred in the above-described low-pass filter.

Figure 2B:
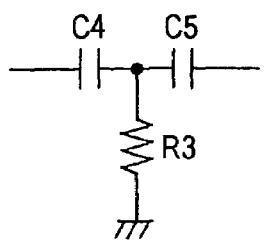

For instance, as represented in FIG. 2B, the differentiating circuit 15 may be alternatively arranged by connecting two capacitors C4 and C5 in a series manner, and by connecting a resistor R3 between a junction point of these capacitors C4 and C5, and the ground, namely, may be alternatively arranged by a secondary differentiating circuit. Since such a circuit arrangement is employed, although the class-D amplifier is made of a simple circuit arrangement, the deterioration of the frequency characteristic of the class-D amplifier can be effectively suppressed not only when the class-D amplifier is operated under no load and light load conditions, but also when the class-D amplifier is operated under normal load condition. The output peak of the class-D amplifier during either no load condition or the light load condition can be suppressed.

In accordance with the class-D amplifier of this embodiment mode, the negative feedback circuit constructed of the differentiating circuit 15 is employed as the circuit capable of suppressing the output peak while the class-D amplifier is operated under no load condition, or under light load condition. As a result, the damper circuit which has been employed in the conventional class-D amplifier is no longer required, and while the output peak is suppressed, the loss caused by the damper circuit becomes zero, so that the efficiency of the class-D amplifier according to this embodiment mode can be improved, as compared with that of the conventional class-D amplifier.

Figure 3:
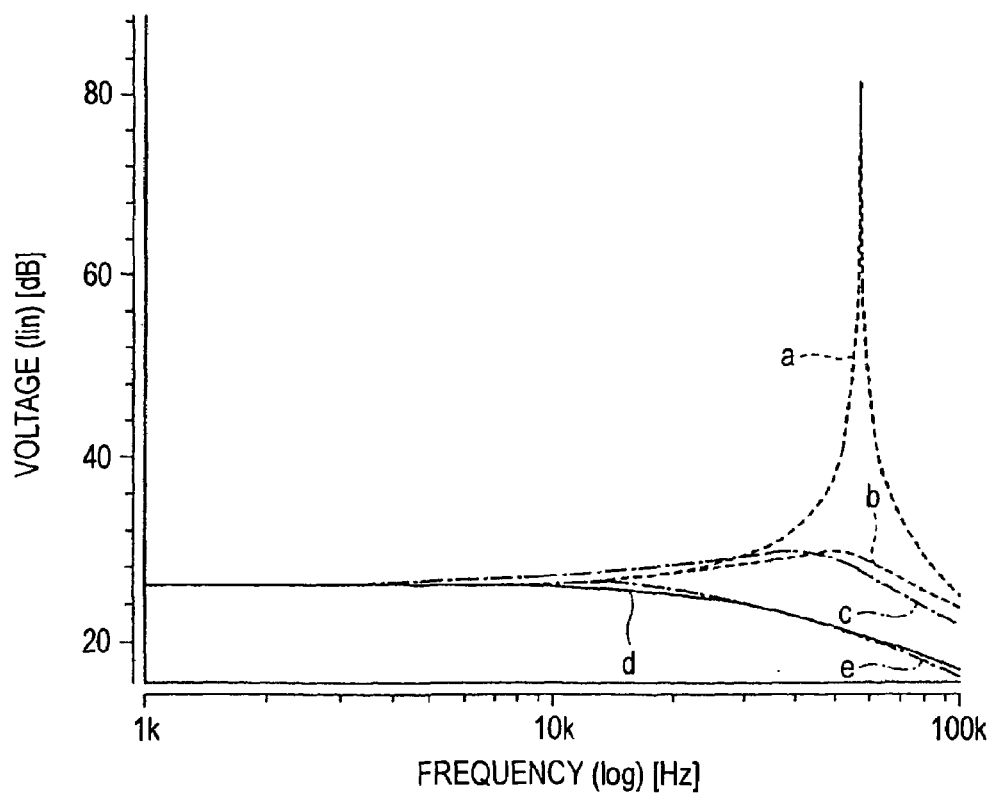
FIG. 3 is a diagram for graphically showing a frequency characteristic as to an output of the class-D amplifier shown in FIG. 1.
Figure 4:
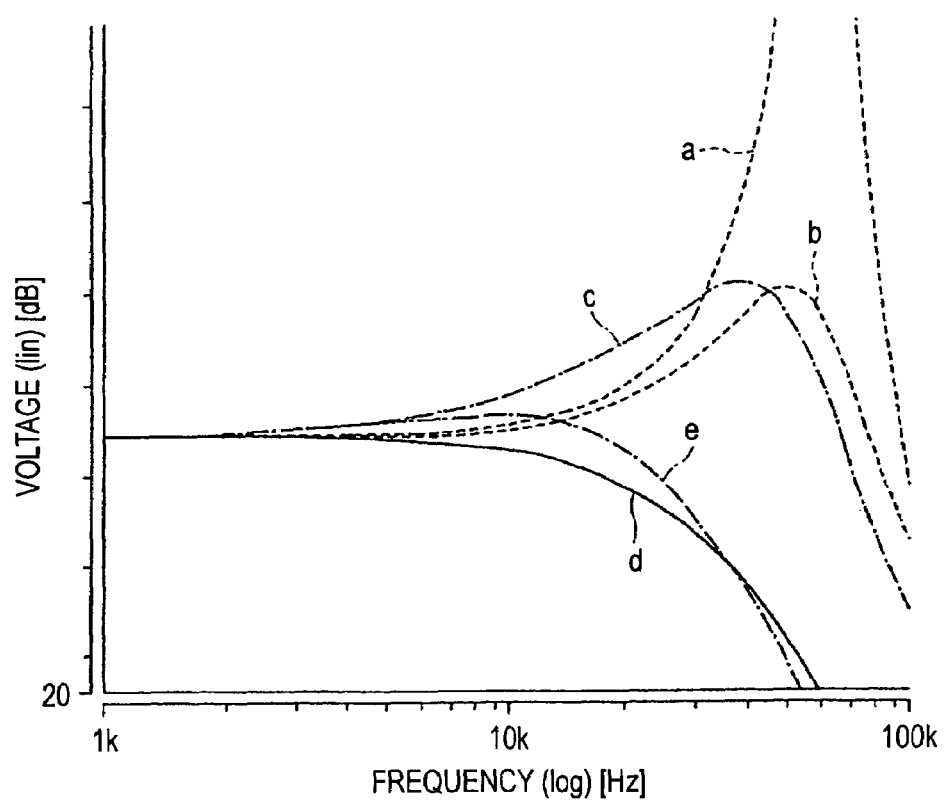
FIG. 4 is a diagram for graphically representing an enlarged major portion of the frequency characteristic as to the output of the class-D amplifier represented in FIGS. 2A and 2B.

Next, a description is made of effects achieved by the class-D amplifier according to this embodiment mode with reference to FIG. 3 and FIG. 4.

FIG. 3 is a diagram for graphically showing a frequency characteristic as to an output signal of the class-D amplifier shown in FIG. 1. FIG. 4 is another diagram for graphically representing an enlarged major portion of the frequency characteristic represented in FIG. 3. In FIG. 3 and FIG. 4, an abscissa indicates a frequency [Hz] of an output of the class-D amplifier shown in FIG. 1, whereas an ordinate shows an output voltage [V] of the class-D amplifier indicated in FIG. 1.

In FIG. 3 and FIG. 4, a characteristic curve "a" indicates an output characteristic when the load 16 is brought into no load state under such a condition that the differentiating circuit 15 has been deleted in the class-D amplifier shown in FIG. 1. Under this condition, since the differentiating circuit 15 is not employed, a large output peak appears.

Another characteristic curve "b" indicates such an output characteristic that one capacitor C3 is employed as the differentiating circuit 15 as shown in FIG. 2A in the class-D amplifier indicated in FIG. 1 when the load 16 is brought into no load condition. Under this condition, since the differentiating circuit 15 functions, an output peak of this characteristic curve "b" is largely lowered, as compared with the output peak of the characteristic curve "a."

Another characteristic curve "c" indicates such an output characteristic that two capacitors C4 and C5 and one resistor R3 are used to construct the above-described secondary differentiating circuit as the differentiating circuit 15 as shown in FIG. 2B in the class-D amplifier indicated in FIG. 1 when the load 16 is brought into no load condition. Under this condition, since the differentiating circuit 15 functions, an output peak of this characteristic curve "c" is largely lowered, as compared with the output peak of the characteristic curve "a. " It should be noted that both the characteristic curve "c" and the characteristic curve "b" constitute substantially same characteristics.

Another characteristic curve "d" indicates such an output characteristic that one capacitor C3 is employed as the differentiating circuit 15 as shown in FIG. 2A in the class-D amplifier indicated in FIG. 1 when the load 16 is brought into the rated load condition. Under this condition, since the differentiating circuit 15 functions, although an output peak of this characteristic curve "d" becomes substantially no peak value, this characteristic curve "d" becomes such a characteristic that an attenuation occurs in a high frequency.

Another characteristic curve "e" indicates such an output characteristic that two capacitors C4 and C5 and one resistor R3 are used to construct the above-described secondary differentiating circuit as the differentiating circuit 15 as shown in FIG. 2B in the class-D amplifier indicated in FIG. 1 when the load 16 is brought into the rated load condition. Even under this condition, since the differentiating circuit 15 functions, an output signal of 6 this characteristic curve "e" has substantially no peak. Furthermore, in this characteristic curve "e", since the secondary differentiating circuit is employed as the differentiating circuit 15, the frequency characteristic is further flattened to be improved, as compared with that of the characteristic curve "d."

Figure 5:
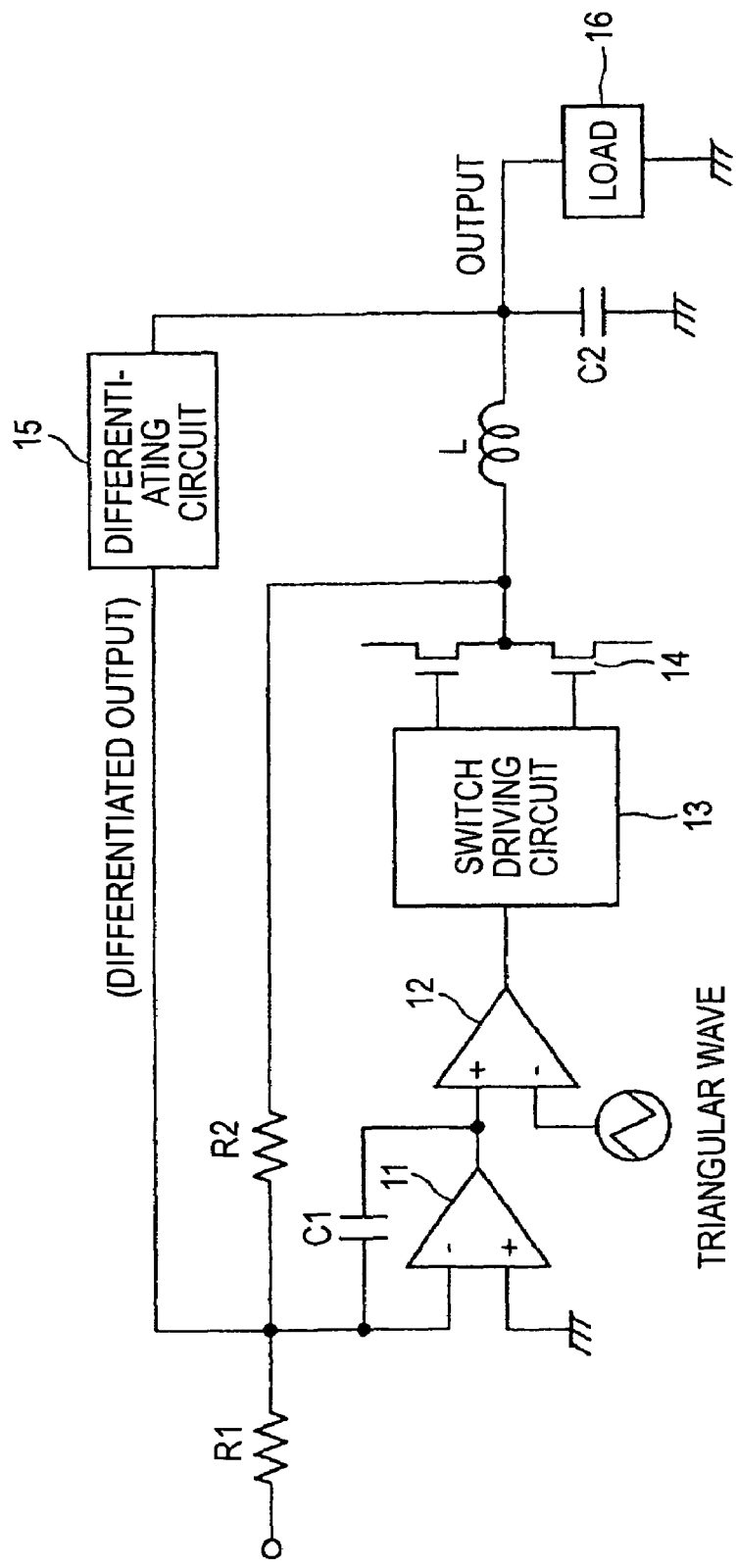
FIG. 5 is a circuit diagram for showing a structural example of a class-D amplifier according to another embodiment mode of the present invention.
Figure 6:
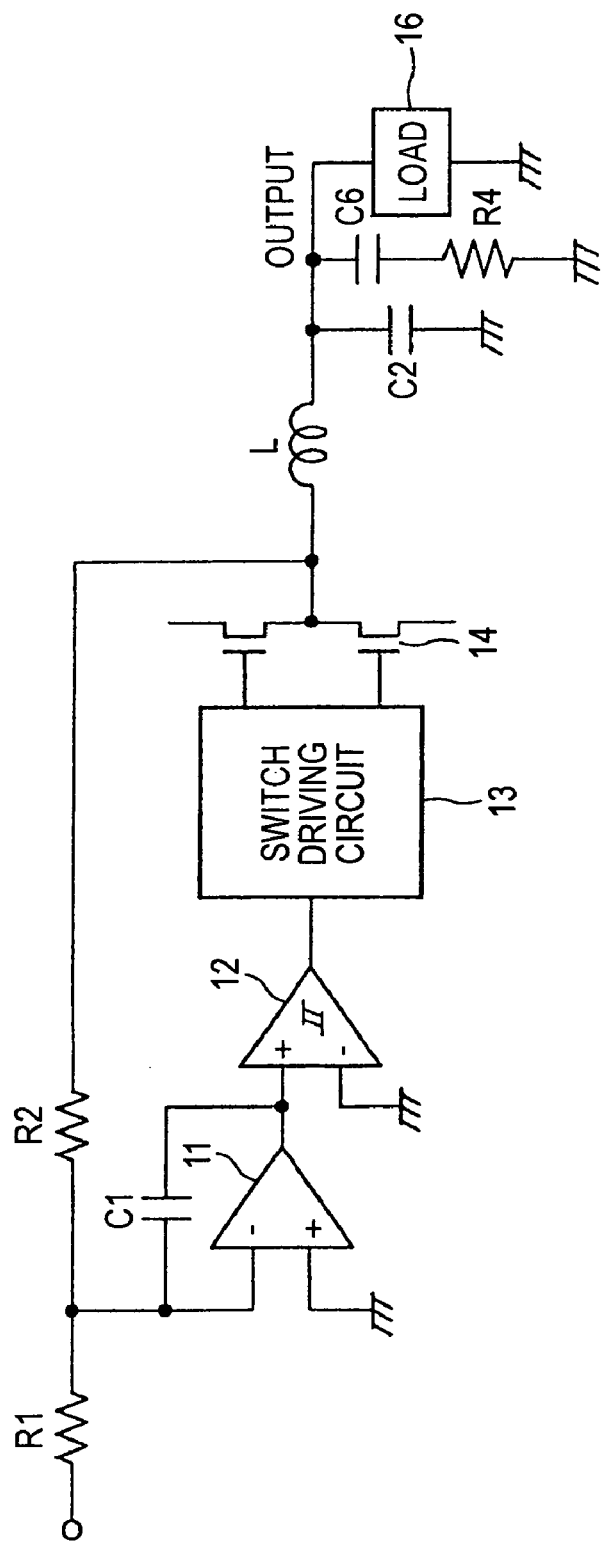
FIG. 6 is a circuit diagram for indicating the example of the conventional class-D amplifier.

Next, another embodiment mode will now be described with reference to FIG. 5. FIG. 5 is a circuit diagram for representing a structural example of a class-D amplifier (separately excited type) according to another embodiment mode of the present invention. It should also be noted that the same reference numerals shown in FIG. 1 are employed as those for denoting the same structural elements of FIG. 5.

A different point between this separately excited type class-D amplifier and the self-excited type class-D amplifier shown in FIG. 1 is a signal (reference value) which is entered to one terminal (minus-sided terminal) of the comparator 12. In other words, in the self-excited type class-D amplifier shown in FIG. 1, the earth potential (zero volt) is inputted to one terminal (minus-sided terminal) of the comparator 12, whereas in the separately excited class-D amplifier according to this embodiment and indicated in FIG. 5, a triangular wave is inputted to one terminal (minus-sided terminal) of the comparator 12. It should also be understood that an operation, an effect, and an advantage of this separately excited type class-D amplifier according to this embodiment mode are similar to those of the self-excited type class-D amplifier.

While the embodiment mode of the present invention has been described in detail with reference to the drawings, the concrete structure thereof is not limited only to this embodiment mode, but may apparently cover structures defined within the range without departing from the technical spirit of the present invention.

In the above-explained description, the present invention has been described as the class-D amplifiers, but the present invention is not limited only thereto. Accordingly, the present invention may be applied to signal processing circuits other than the class-D amplifiers, various sorts of pulse width modulation amplifier, and various sorts of load driving circuit.

What is claimed is:

1. A class-D amplifier, comprising:
   a pulse width modulating circuit that pulse-width-modulates an analog input signal to output a pulse-width-modulated signal;
   a low-pass filter that inputs the pulse-width-modulated signal output from the pulse width modulating circuit and provides an output;
   a differentiating circuit that differentiates the output of the low-pass filter to provide a differentiated signal; and
   a negative feedback circuit that feeds back the differentiated signal of the differentiating circuit to an input side of the class-D amplifier in a negative feedback manner.

2. The class-D amplifier according to claim 1, wherein the pulse width modulating circuit includes:
   an integrator for integrating the analog input signal;
   a comparator for comparing an integrated analog signal output from the integrator with a reference value; and
   a negative feedback circuit for feeding back a pulse signal output of the comparator to an input side of the integrator in a negative feedback manner.

3. The class-D amplifier according to claim 2, wherein the pulse width modulating circuit includes:
   a switch driving circuit for outputting the pulse signal outputted from the comparator as one pair of pulse signals having phases opposite to each other; and
   a switch circuit that is driven by the switch driving circuit, the switch driving circuit and the switch circuit being arranged at a post stage of the comparator,
   wherein the negative feedback circuit feeds back the output of said switch circuit to the input side of said integrator in the negative feedback manner.

4. The class-D amplifier according to claim 3, wherein:
   the switch circuit includes two transistors,
   each of control terminals of the two transistors is connected to any one of two output terminals of the switch driving circuit,
   output terminals of the two transistors are series-connected to each other, and
   a connection portion between the output terminals of the two transistors is used as the output of the pulse width modulating circuit and the input of the negative feedback circuit.

5. The class-D amplifier according to claim 1, wherein the differentiating circuit includes a capacitor.

6. The class-D amplifier according to claim 1, wherein the differentiating circuit includes two capacitors connected in a series manner, and a resistor connected between a junction point of the two capacitors and a ground.

* * * * *